(12) United States Patent
Terao (10) Patent No.: US 9,497,869 B2
(45) Date of Patent: Nov. 15, 2016

(54) SUPPORT DEVICE AND SUPPORT METHOD (71) Applicant: NEC Platforms, Ltd., Kawasaki-shi, Kanagawa (JP)

(72) Inventor: Chiaki Terao, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 14/783,126

(22) PCT Filed: Aug. 5, 2014

(86) PCT No.: PCT/JP2014/071137
§ 371 (c)(1),
(2) Date: Oct. 8, 2015

(87) PCT Pub. No.: WO2015/029759
PCT Pub. Date: Mar. 5, 2015

(65) Prior Publication Data
US 2016/0037662 A1 Feb. 4, 2016

(30) Foreign Application Priority Data
Aug. 28, 2013 (JP) ................................ 2013-177190

(51) Int. Cl.
*H05K 5/02* (2006.01)
*F16M 11/00* (2006.01)
(Continued)

(52) U.S. Cl.
CPC ............. *H05K 5/0204* (2013.01); *F16C 11/10* (2013.01); *F16M 11/00* (2013.01); *F16M 13/02* (2013.01)

(58) Field of Classification Search
CPC ...... F16M 11/00; F16M 11/10; F16M 13/02; H05K 5/0204; F16C 11/10

USPC ........................................................ 248/283.1
See application file for complete search history.

(56) References Cited

U.S. PATENT DOCUMENTS

| | | | | |
|---|---|---|---|---|
| 7,793,903 B2* | 9/2010 | Dittmer | ................ | F16M 11/048 248/276.1 |
| 7,950,613 B2* | 5/2011 | Anderson | .............. | F16M 13/02 248/282.1 |
| 8,888,062 B2* | 11/2014 | Novin | .................... | F16M 11/04 248/274.1 |

(Continued)

FOREIGN PATENT DOCUMENTS

| | | |
|---|---|---|
| CN | 1753448 A | 3/2006 |
| CN | 101842632 A | 9/2010 |

(Continued)

OTHER PUBLICATIONS

International Search Report for PCT/JP2014071137 dated Oct. 7, 2014 [PCT/ISA/210].

(Continued)

*Primary Examiner* — Anita M King
(74) *Attorney, Agent, or Firm* — Sughrue Mion, PLLC (57) ABSTRACT

Provided is a technology capable of reducing a surface area taken up on a wall surface and improving maintenance workability. A support device of this invention includes: a pair of support legs configured to be mounted to a side surface of a housing to support the housing; a pair of fixing legs configured to be mounted to a mounting surface at which the housing is to be installed to fix the housing at a position at which the housing is to be installed; and a movable mechanism configured to pivotably couple the pair of support legs and the pair of fixing legs.

7 Claims, 12 Drawing Sheets

(51) Int. Cl.
*F16C 11/10* (2006.01)
*F16M 13/02* (2006.01)

(56) References Cited

U.S. PATENT DOCUMENTS

2006/0083564 A1   4/2006  Yazawa et al.
2008/0237424 A1*  10/2008 Clary .................... F16M 11/04
                                                   248/283.1
2010/0246197 A1   9/2010  Takahashi et al.
2011/0062703 A1   3/2011  Lopez et al.

FOREIGN PATENT DOCUMENTS

| CN | 102724946 A | 10/2012 |
|----|-------------|---------|
| JP | 02-052478 U | 4/1990  |
| JP | 05-085186 U | 11/1993 |
| JP | 2001-339172 A | 12/2001 |
| JP | 2007-094285 A | 4/2007 |
| JP | 2010-171177 A | 8/2010 |

OTHER PUBLICATIONS

Written Opinion for PCT/JP2014071137 dated Oct. 7, 2014 [PCT/ISA/237].

Communication dated Mar. 9, 2016 from the State Intellectual Property Office of the P.R.C. issued in corresponding Application No. 201480024454.0.

* cited by examiner

SUPPORT DEVICE AND SUPPORT METHOD

CROSS REFERENCE TO RELATED APPLICATIONS

This application is a National Stage of International Application No. PCT/JP2014/071137 filed Aug. 5, 2014, claiming priority based on Japanese Patent Application No. 2013-177190 filed Aug. 28, 2013, the contents of all of which are incorporated herein by reference in their entirety.

TECHNICAL FIELD

This invention relates to a support device for wall-mounting electronic device housings, such as communication control devices, and to a support method therefor.

BACKGROUND ART

In order to save a space, support devices for wall-mounting electronic device housings and the like have been developed. For example, there is a support device that is compatible with both an installation method for placing the housing on a table or on a floor, and an installation method for wall-mounting the housing to a wall surface.

As such support device, in Patent Document 1, there is disclosed a support device including a pair of support legs having a plate shape, and including on a first plate surface a leg convex portion or a leg concave portion formed correspondingly to a housing concave portion or a housing convex portion, and an intermediate member. In Patent Document 1, when wall-mounting the housing, the housing is hooked and supported in front of the first plate surface by joining the pair of support legs to each other through the intermediate member and mounting the pair of support legs so that a second plate surface contacts the wall surface, and by engaging the housing concave portion or the housing convex portion formed on the back surface of the housing with the leg convex portion or the leg concave portion.

In Patent Document 2, there is disclosed a wall-mounting device configured to install a plurality of electronic device housings of a telephone exchange and the like on a wall of a building and the like. The wall-mounting device includes a device-mounting bracket to be mounted to the wall, the device-mounting bracket including a receiving shelf on which a lower surface of one electronic device housing among the plurality of electronic device housings is to be placed, a mounting base plate from which the receiving shelf projects, and a mounting portion configured to mount the one electronic device housing to the mounting base plate. The device mounting bracket further includes mounting means for mounting a device extension bracket configured to allow another electronic device housing to be arranged in an overlapping manner in front of the wall of the one electronic device housing. Further, in Patent Document 3, a device is disclosed, in which an extension housing is rotatably arranged by a spindle in a base housing including a basic circuit board and a power supply unit, an extension circuit board is removably arranged in the extension housing, and one side of the extension housing is fixed to a wall surface by a mounting member.

In Patent Document 1 and Patent Document 2, because the electronic device is fixedly mounted to the wall surface, it is necessary to remove the electronic device each time when a maintenance work is carried out. In Patent Document 3, the electronic device housing and the like needs to be mounted as a set, and hence it is difficult to achieve space saving. Further, because the housing cannot be integrally moved, there is a problem in that efficient maintenance work cannot be performed.

Figure 10:
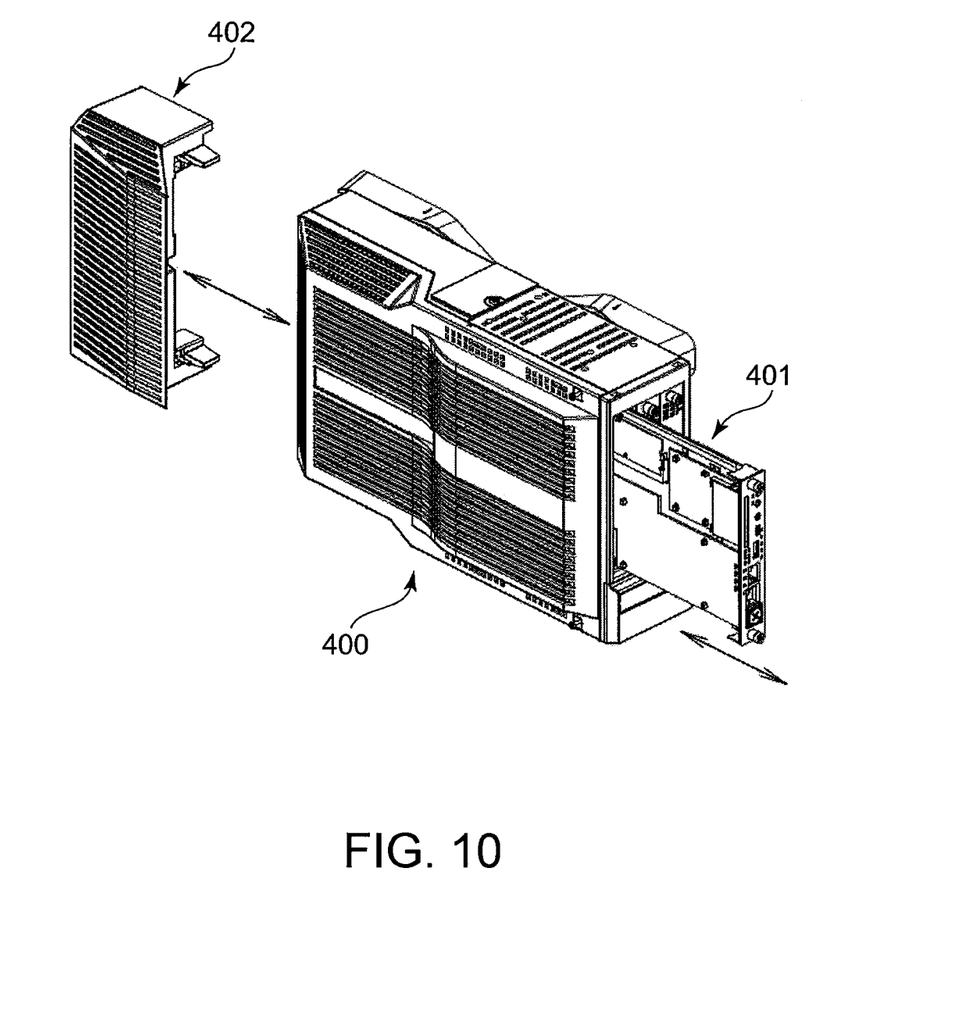
FIG. 10 is a diagram for illustrating a configuration of a control device mounted to an associated support device.
Figure 11:
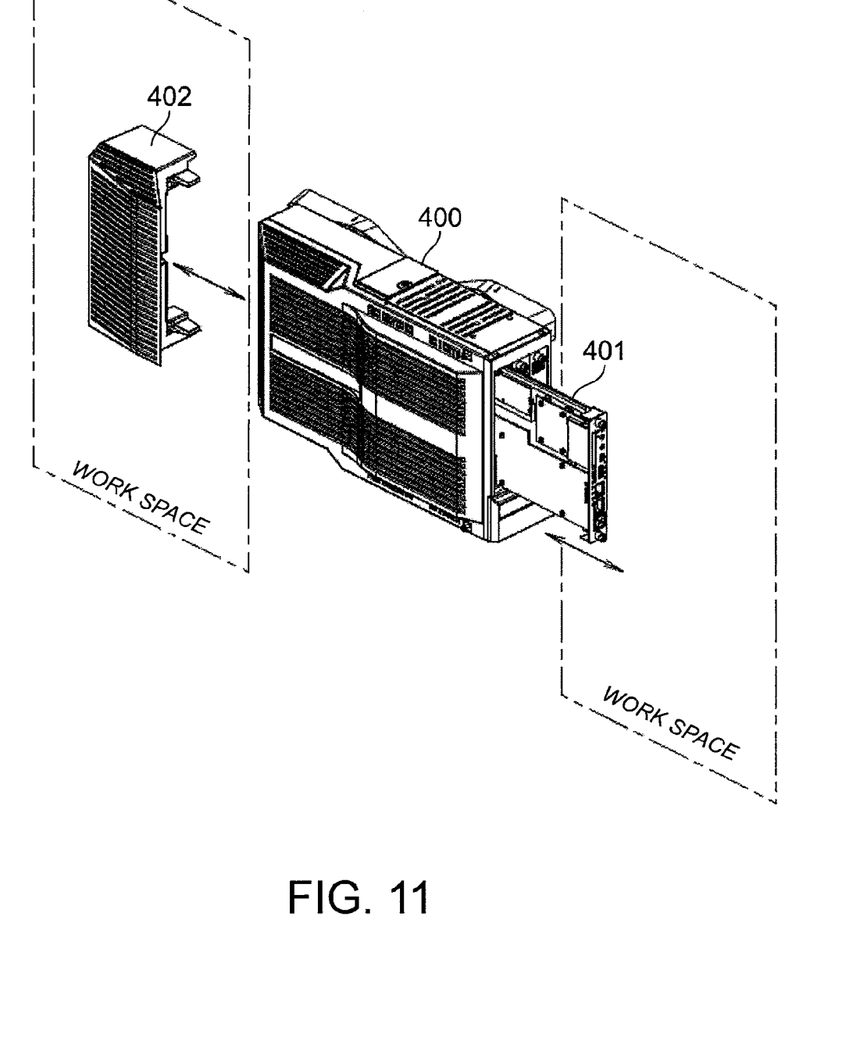
FIG. 11 is a diagram for illustrating a work space when maintaining the control device mounted to the associated support device illustrated in FIG. 10.

In FIG. 10 and FIG. 11, an associated support device for supporting a housing 400 of an electronic device and the like is illustrated. A mounting direction of an option card 401 and a battery 402 to the electronic device mounted to the support device extends from a side surface of the electronic device. As a result, during wall-mounting the electronic device, it is necessary to secure a work space for the maintenance work of the option card 401 or the battery 402. Further, when it is difficult to secure the maintenance space, the electronic device needs to be dismounted from the wall surface each time when the maintenance work is carried out. In addition, during the maintenance work, because the mounting direction of each ancillary device is different, the work cannot be performed from the same direction, which makes maintenance work more complex.

Figure 12:
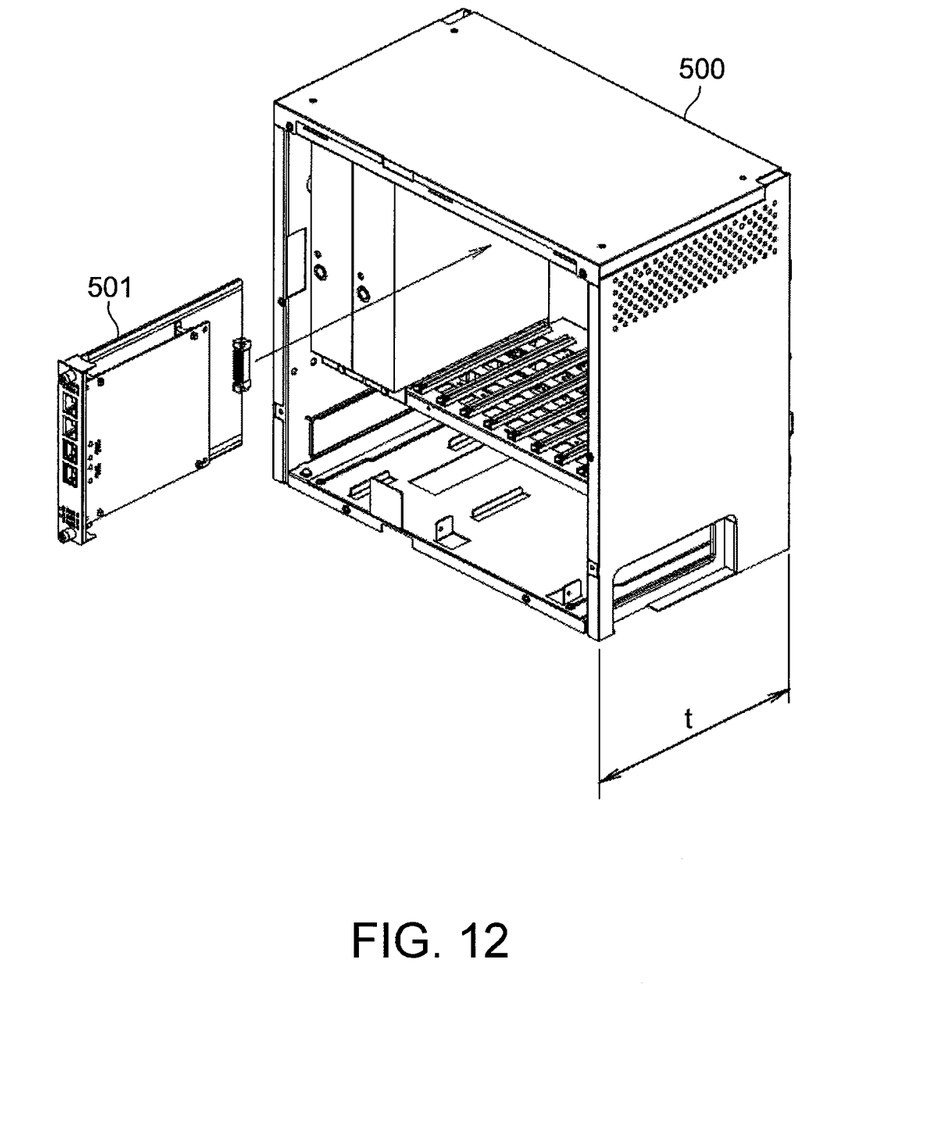
FIG. 12 is a diagram for illustrating a configuration of the associated support device.

In FIG. 12, an associated support device 500 for storing an electronic device and installing the electronic device at a predetermined position is illustrated. With the support device 500 such as that illustrated in FIG. 12, although an option card 501 can be mounted from the front surface, the profile of the overall device increases, and hence under an installed state the device protrudes further from the wall surface.

PRIOR ART DOCUMENTS

Patent Documents

Patent Document 1: JP-A-2010-171177
Patent Document 2: JP-A-2001-339172
Patent Document 3: JP-U-H05-85186

DISCLOSURE OF THE INVENTION

Problem to be Solved by the Invention

Maintenance work, such as repair work and extension work, may be carried out after the electronic device housing and the like has been mounted to the support device and installed by mounting to the wall. In the case of a support device such as that illustrated in FIG. 10 and FIG. 11, the maintenance work must be carried out from the side surface of the housing, which makes maintenance work more difficult and causes work efficiency to be deteriorated. In the case of the example illustrated in FIG. 12, although the maintenance work can be carried out from the front surface of the housing, the profile of the overall device increases, and hence the space saving cannot be achieved.

It is an object of this invention to provide a support device configured to pivotably wall-mount an entire electronic device housing, and a support method.

Means to Solve the Problem

In view of the above-mentioned problems, one aspect of this invention relates to a support device, including: a pair of support legs configured to be mounted to a side surface of a housing to support the housing; a pair of fixing legs configured to be mounted to a mounting surface at which the housing is to be installed to fix the housing at a position at which the housing is to be installed; and a movable mechanism configured to pivotably couple the pair of support legs and the pair of fixing legs.

Further, another aspect of this invention relates to a support method, including: pivotably coupling a pair of support legs and a pair of fixing legs; fixing the coupled pair of fixing legs to a mounting surface; installing a housing on the mounting surface by mounting the housing to the pair of support legs; and adjusting, during maintenance, an angle formed between the mounting surface and the housing by pivoting the pair of support legs.

Effect of the Invention

According to the aspects of this invention, when installing a control device housing and the like on a wall surface, the surface area taken up on the wall surface can be reduced and the maintenance workability can be improved.

Further advantages and embodiments of this invention are described below in more detail based on the description with reference to the drawings.

MODES FOR EMBODYING THE INVENTION

A support device and a support method according to embodiments of this invention are now described in detail with reference to the attached drawings. However, the technical scope of this invention is not in any way limited by the embodiments described below.

First Embodiment

Figure 1:
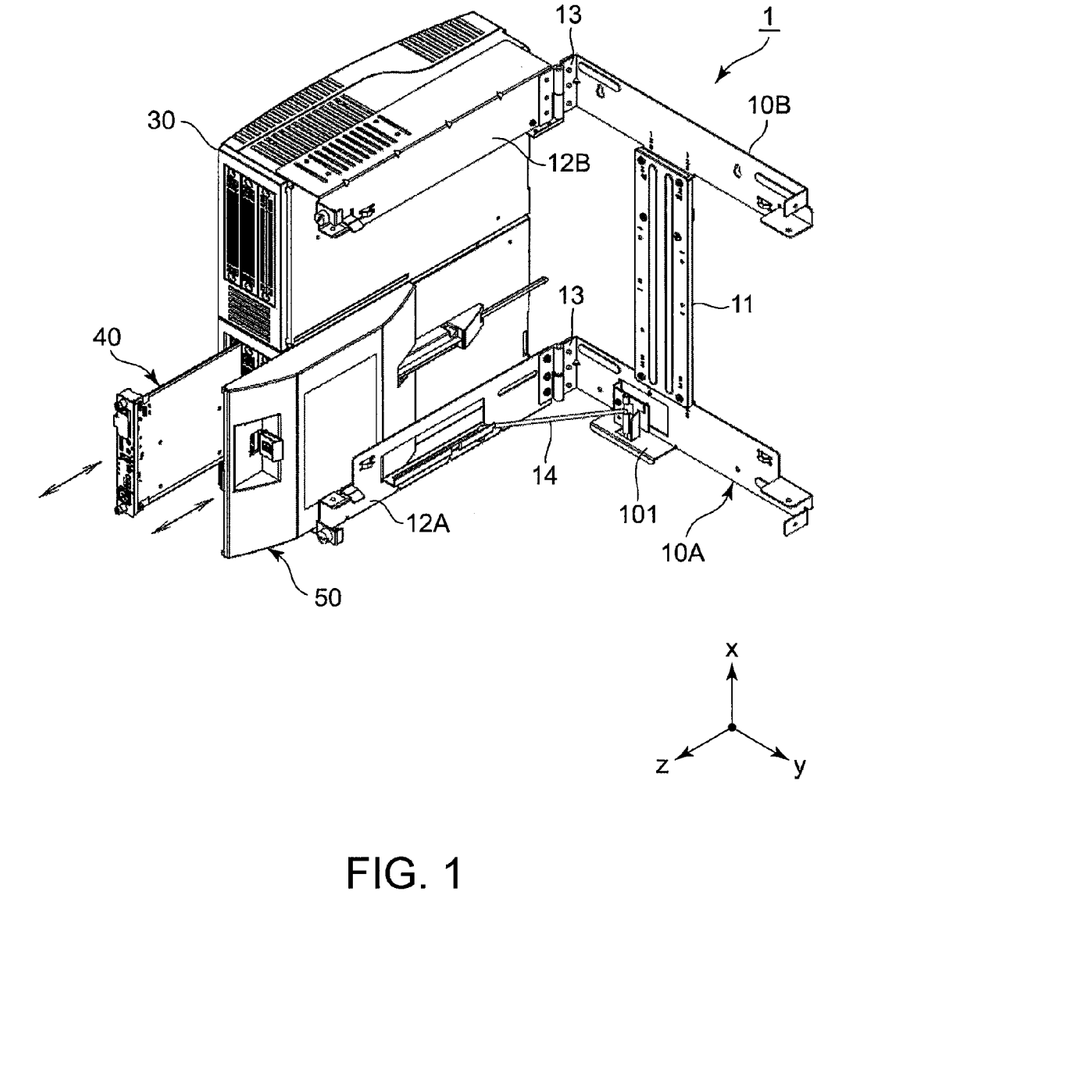
FIG. 1 is a schematic configuration diagram for illustrating a configuration in which a control device is mounted to a support device according to a first embodiment of this invention.

First, a first embodiment of this invention is described. FIG. 1 is a schematic configuration diagram for illustrating a configuration of a support device 1 according to this embodiment. In FIG. 1, the support device 1 is utilized for the wall mounting of an electronic device, such as a key telephone main device, and a housing 30 thereof. During maintenance work, a work space can be secured without needing to remove the housing 30 from the support device 1 by pivoting (rotating) support legs 12A and 12B of the support device 1 to which the housing 30 is mounted about a movable mechanism.

As illustrated in FIG. 1 to FIG. 4, a Cartesian coordinate system (X, Y, Z) is employed. In the states illustrated in FIG. 1 to FIG. 4, the X-axis direction in the Cartesian coordinate system (X, Y, Z) is the vertical direction (height direction) extending parallel to a mounting surface 200 on which the support device 1 is to be installed, the Y-axis direction is the horizontal direction (width direction) extending parallel to the mounting surface 200 and orthogonal to the X-axis direction, and the Z-axis direction is the front-back direction (depth direction) orthogonal to the mounting surface 200.

Figure 2:
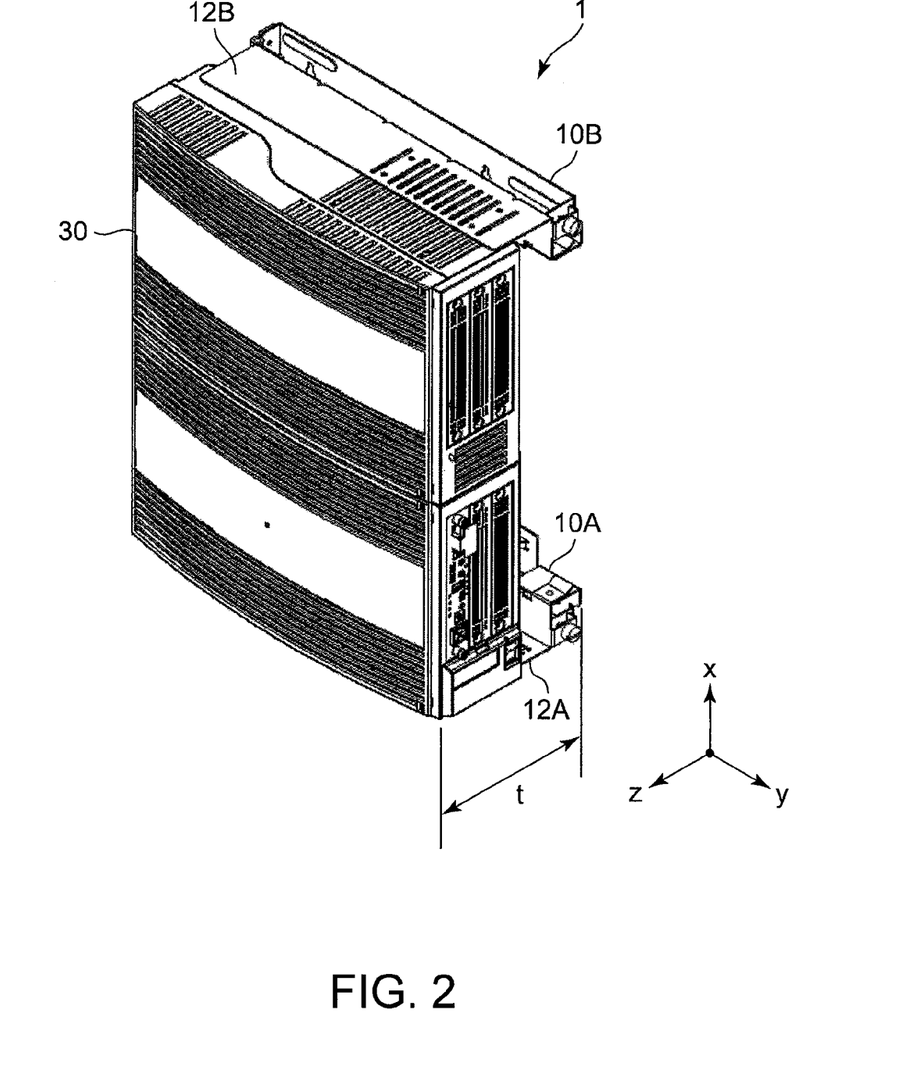
FIG. 2 is a diagram for illustrating a folded state of the support device illustrated in FIG. 1.

FIG. 1 and FIG. 2 are diagrams for illustrating the support device 1 according to this embodiment to which the housing 30 of a control device and the like is mounted. The support device 1 illustrated in FIG. 1 is in an opened state for allowing operations such as maintenance work and mounting/dismounting of an ancillary device. The support device 1 of FIG. 2 is in a state in which the support device 1 illustrated in FIG. 1 has been folded. As illustrated in FIG. 1, when the support device 1 has been opened by 90°, an ancillary device, such as an option card 40 and a battery 50, can be mounted and dismounted, and the maintenance work on the housing 30 of a control device and the like can be carried out. Normally, as illustrated in FIG. 2, the support device 1 and the housing 30 mounted to the support device 1 can be compactly installed so that the support device 1 is folded in close contact to the mounting surface 200, such as a wall. With this support device 1, it is not necessary to remove the housing 30 of a control device each time when the maintenance work is carried out.

Figure 3:
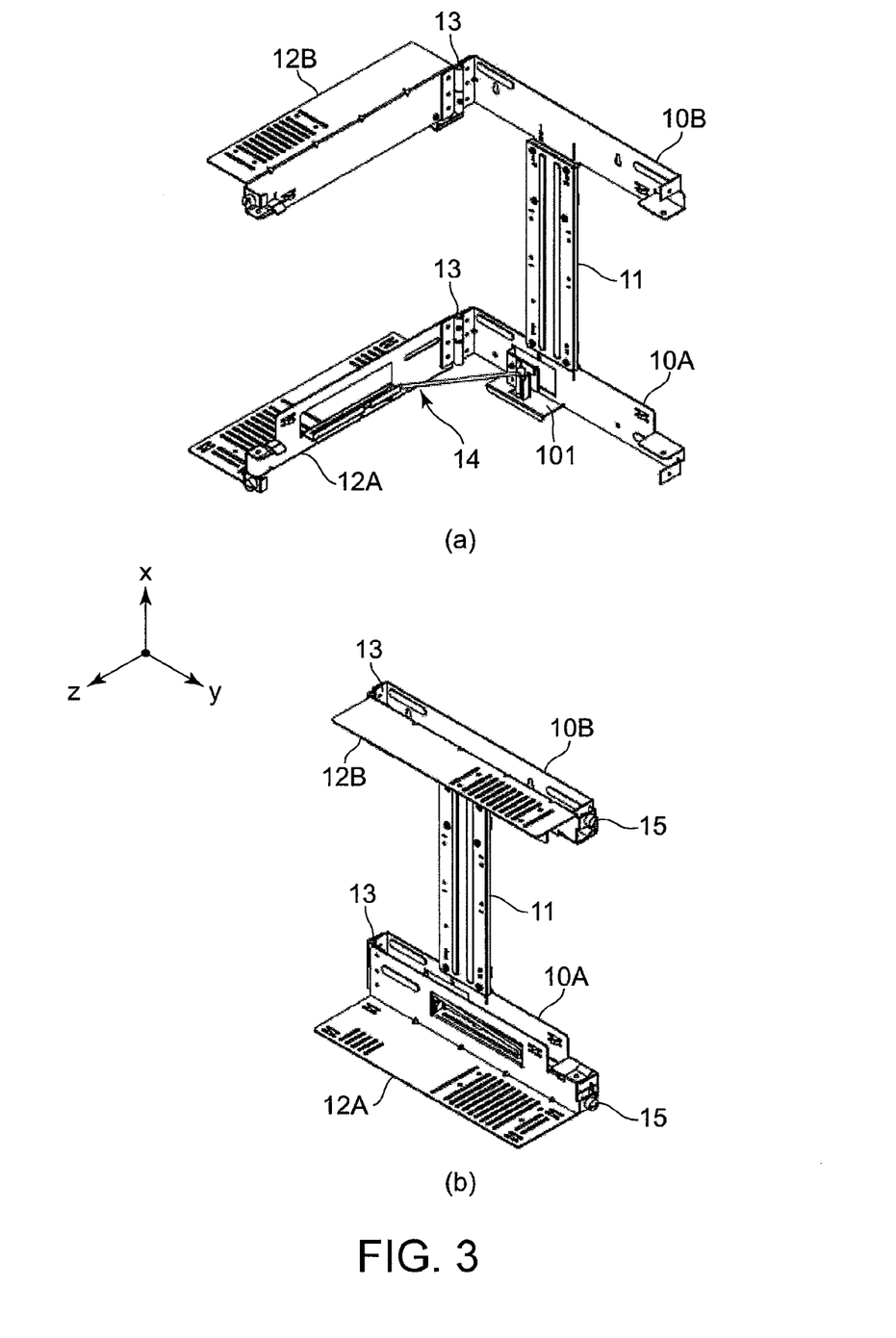
FIG. 3 includes diagrams for illustrating a schematic configuration of the support device according to the first embodiment of this invention. (a) is a diagram for illustrating an opened state, and (b) is a diagram for illustrating a folded state.

FIG. 3 shows diagrams for illustrating a schematic configuration of the support device 1 according to the first embodiment. FIG. 3(a) is a diagram in which the support legs 12A and 12B of the support device 1 have been rotated 90° about the movable mechanism in the Z-axis direction from the Y-axis direction. FIG. 3(b) is a diagram in which the support legs 12A and 12B are arranged in the Y-axis direction, and the support device 1 is folded so that the support legs 12A and 12B and fixing legs 10A and 10B are fixed.

As illustrated in FIG. 3, the support device 1 includes the fixing legs 10A and 10B to be fixed to the mounting surface 200, such as a wall, a height-adjustment member 11 indirectly connecting the fixing legs 10A and 10B, and the support legs 12A and 12B configured to support the housing 30. Further, the support device 1 includes hinges 13 for pivotably coupling the fixing legs 10A and 10B to the support legs 12A and 12B, and an angle-adjustment shaft 14 configured to adjust a position of the housing 30 that pivots (rotates) with the support legs 12A and 12B.

The fixing legs 10A and 10B are a pair of brackets having a rectangular shape, which may be, for example, formed of plate-shaped brackets. The fixing legs 10A and 10B are fixed to the mounting surface 200, such as a wall, using fixing means, such as a screw. Further, the fixing leg 10A includes a shaft mounting portion 101 for mounting the angle-adjustment shaft 14.

The height-adjustment member 11 is a plate-shaped bracket having a rectangular shape, for example. The fixing legs 10A and 10B, which are arranged in parallel, are indirectly connected to each other through the height-adjustment member 11. In this embodiment, as illustrated in FIG. 1, the height-adjustment member 11 is perpendicularly connected at a position roughly midway in the longitudinal direction of each of the parallelly-arranged fixing legs 10A and 10B.

The support legs 12A and 12B are a pair of brackets having an L-shape, which are formed of, for example, plate-shaped brackets. The support leg 12A extends in an L-shape in the −Y-axis direction of the Y-Z plane and the X-axis direction of the X-Z plane. The support leg 12B extends in an L-shape in the −Y-axis direction of the Y-Z plane and the −X-axis direction of the X-Z plane. Housing mounting holes 16A and 16B for supporting the housing 30 are formed on a portion of a plane parallel to the Y-Z plane of each of the support legs 12A and 12B. The housing 30 is supported by, for example, fixing with fixing means, such as a screw, in the housing mounting hole 16A or 16B. Further, shaft fixing grooves 121 and 122 (described later) are formed on the support leg 12A.

As illustrated in FIG. 3(a), the hinge 13 is connected as a member for coupling the fixing leg 10A to the support leg 12A or the fixing leg 10B to the support leg 12B to an end portion in the longitudinal direction of each of the fixing legs 10A and 10B and each of the support legs 12A and 12B. Based on this configuration, the hinge 13A acts as the movable mechanism enabling the support legs 12A and 12B and the housing 30 supported by the support legs 12A and 12B to be pivoted by 90° from the X-Y plane to the X-Z plane. Further, as illustrated in FIG. 2, this configuration also enables the housing 30 supported by the support legs 12A and 12B to be arranged on the mounting surface 200. In addition, the height in the X-axis direction between the fixing legs 10A and 10B and the height in the X-axis direction between the support legs 12A and 12B become the same. This height is determined by the height-adjustment member 11. In this embodiment, the height is equivalent to two housings 30. However, this invention is not limited to this configuration.

As illustrated in FIG. 2, when the support device 1 to which the housing 30 is mounted is in a folded state, space saving is achieved because a thickness t from the mounting surface 200, such as a wall, can be suppressed. On the other hand, when performing maintenance or cabling work, because the support device 1 can be opened to the state illustrated in FIG. 1, a work space can be secured and the maintenance operation can be carried out easily. Further, the ancillary devices, such as the option card 40 and the battery 50, can be mounted and dismounted in the same direction from the front surface of the housing 30. The support device 1 enters the folded state by inserting and fixing a male screw 15, such as a knurled screw, on each of the support legs 12A and 12B into the corresponding fixing leg 10A or 10B.

Figure 4:
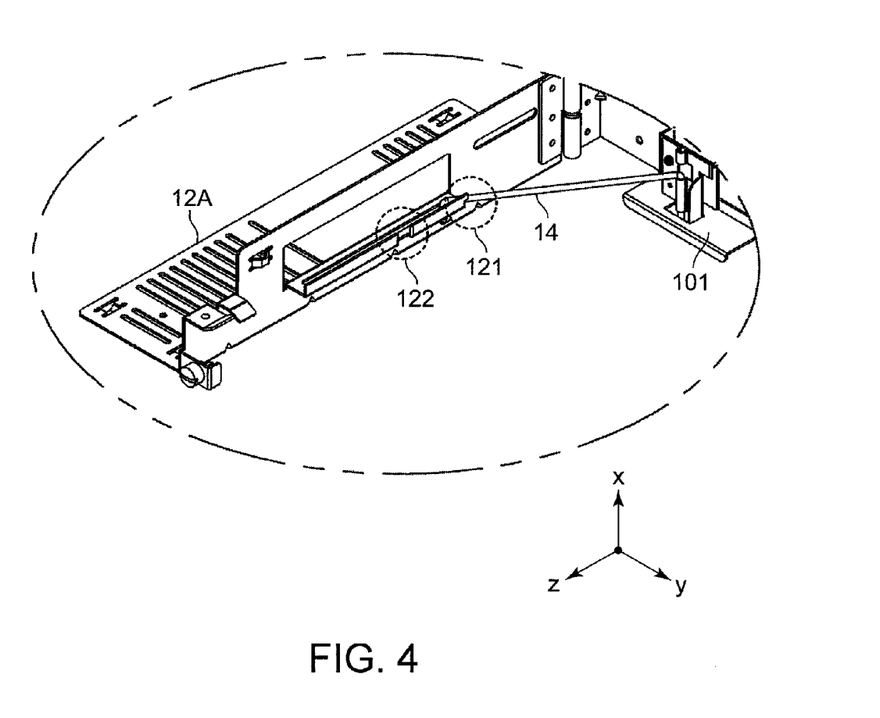
FIG. 4 is an enlarged view of main parts for illustrating a movable mechanism of the support device illustrated in FIG. 3.

FIG. 4 is an enlarged view of main parts of the support leg 12A of the support device 1 according to this embodiment. The support device 1 illustrated in FIG. 4 is in a state in which the support legs 12A and 12B have been opened by 90° about the hinges 13 in the X-axis direction from the Y-axis direction. In this embodiment, the support leg 12A includes the shaft fixing groove 121 for fixing at 90° and the shaft fixing groove 122 for fixing at 50°. In FIG. 4, the angle-adjustment shaft 14 mounted to the shaft mounting portion 101 of the fixing leg 10A is fixed to the shaft fixing groove 121 for fixing at 90°. In order to secure a work space and adjust the work position, the support legs 12A and 12B and the housing 30 mounted to the support legs 12A and 12B can be arranged at a position rotated 50° from the Y-axis direction by fixing the angle-adjustment shaft 14 in the shaft fixing groove 122 for fixing at 50°. In this embodiment, the two shaft fixing grooves 121 and 122 for fixing at 90° and at 50° are described as examples. However, this invention is not limited to such a configuration. For example, shaft fixing grooves for fixing at 30° and at 150° may be used as appropriate.

Next, a method of supporting the housing 30 of an electronic device and the like to be mounted to the support device 1 according to this embodiment is described.

During maintenance work on the housing 30 mounted to the support device 1, first, the male screws 15 fixing each of the support legs 12A and 12B and each of the fixing legs 10A and 10B are removed. Then, the support device 1 is opened by pivoting the pair of support legs 12A and 12B together with the mounted housing 30 in the Z-axis direction from the Y-axis direction. Next, the support legs 12A and 12B are fixed at a desired angle using the angle-adjustment shaft 14. In this embodiment, the support legs 12A and 12B and the mounted housing 30 can be fixed at an angle of 50° or 90° by inserting the angle-adjustment shaft 14 in the notch-shaped shaft fixing groove 121 or 122 formed in the support leg 12A. Because a work space can be easily secured in an opened state, maintenance work is performed in this state. After maintenance work has been completed, the support device 1 is folded by pivoting the support legs 12A and 12B and the mounted housing 30 in the Y-axis direction from the Z-axis direction, and fixing each of the support legs 12A and 12B and each of the fixing legs 10A and 10B with the male screws 15.

According to the embodiment of this invention, when installing the housing 30 of a communication control device and the like on the mounting surface 200, such as a wall surface, the surface area taken up on the wall surface can be reduced and maintenance workability can be improved. Further, a plurality of housings 30 can be collectively installed on the mounting surface 200.

Second Embodiment

Next, a second embodiment according to this invention is described. The second embodiment according to this invention is a modified example of the first embodiment. In the following description of the second embodiment, parts that have already been described in the first embodiment and parts having the same function as the parts described in the first embodiment are denoted using the same reference symbols, and a description thereof is omitted. The support device 1 according to the second embodiment is capable of wall mounting various configurations of the housing 30 of various electronic devices and the like.

As illustrated in FIG. 5 to FIG. 9, a Cartesian coordinate system (X, Y, Z) is employed. In the state illustrated in FIG. 5 to FIG. 9, the X-axis direction in the Cartesian coordinate system (X, Y, Z) is the vertical direction (height direction) extending parallel to the mounting surface 200 on which the support device 1 is installed, the Y-axis direction is the horizontal direction (width direction) extending parallel to the mounting surface 200 and orthogonal to the X-axis direction, and the Z-axis direction is the front-back direction (depth direction) orthogonal to the mounting surface 200.

Figure 5:
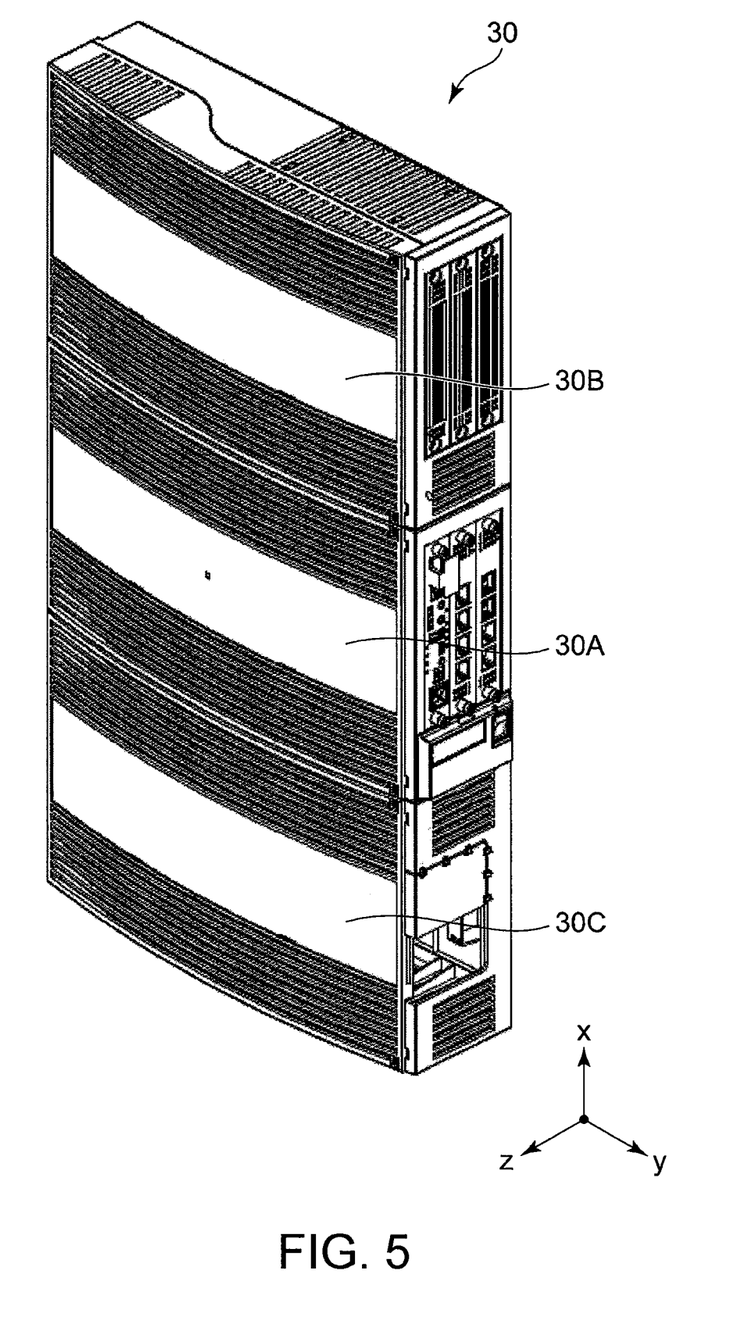
FIG. 5 is a schematic configuration diagram for illustrating a control device capable of being installed on a support device according to a second embodiment of this invention.

FIG. 5 is a diagram for illustrating the housing 30 to be mounted to the support device 1 according to the second embodiment. The housing 30 according to the second embodiment includes a basic frame 30A, an extension frame 30B, and a housing frame 30C. In this embodiment, the support device 1 is configured so that any one of, or all of, these housings 30 may be mounted to the support device 1. The support device 1 is described in more detail below with reference to the drawings.

Figure 6:
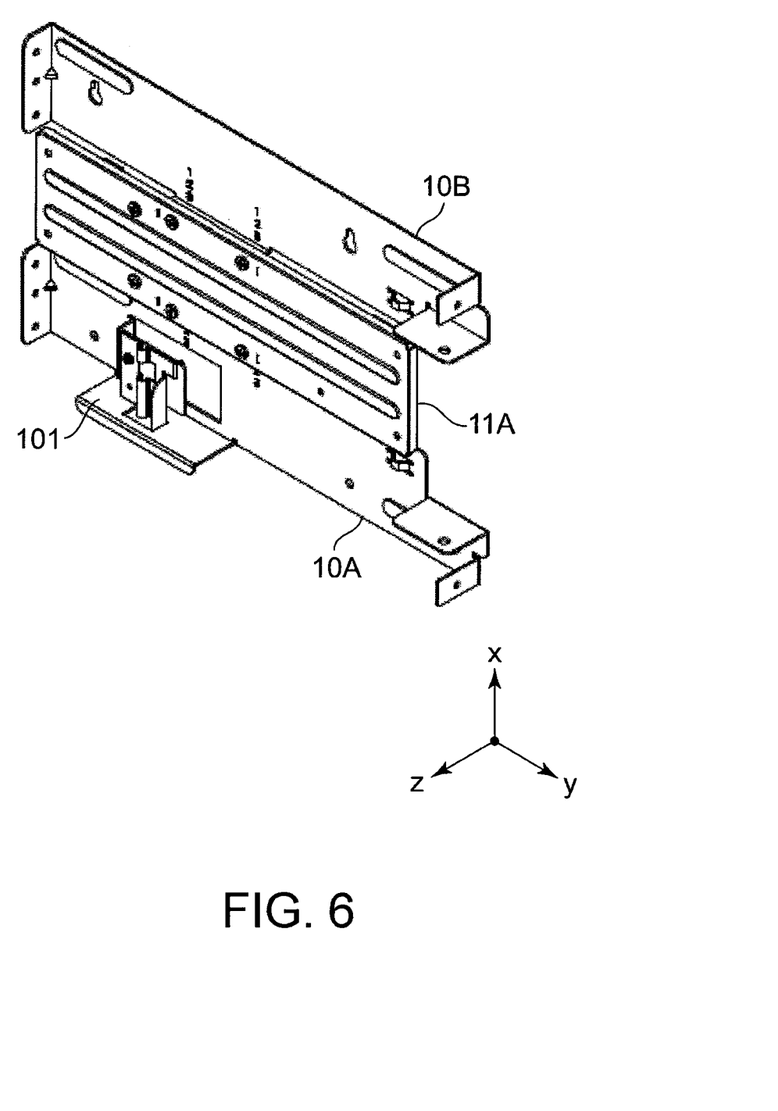
FIG. 6 is a diagram for illustrating a configuration of the support device according to the second embodiment of this invention.

In FIG. 6, a first stage configuration of the support device 1 is illustrated, in which a height-changing portion 11A (height-adjustment member 11) is parallelly arranged between the pair of parallelly-arranged fixing legs 10A and 10B in the same manner so that the longitudinal direction of the height-changing portion 11A and the longitudinal direction of the pair of fixing legs 10A and 10B are connected. Note that, to facilitate the description, a description of the support legs 12A and 12B and the hinge 13 is omitted in the support device 1. The support device 1 having this first stage configuration may be installed on the mounting surface 200 while having any of the basic frame 30A, the extension frame 30B, and the housing frame 30C mounted thereon. In other words, the overall height when the height-changing portion 11A is connected to the fixing legs 10A and 10B illustrated in FIG. 6 is the same height as one basic frame 30A. The height-adjustment member 11 includes the height-changing portion 11A, which has a rectangular plate-shape, and a height-extension portion 11B. The height in the X-axis direction of the support legs 12A and 12B coupled to the pair of fixing legs 10A and 10B by the hinges 13 is determined by connecting the height-changing portion 11A between the pair of fixing legs 10A and 10B and determining the height in the X-axis direction. Note that, in the first stage configuration, the height-extension portion 11B is stored on a back surface of the height-changing portion 11A.

Figure 7:
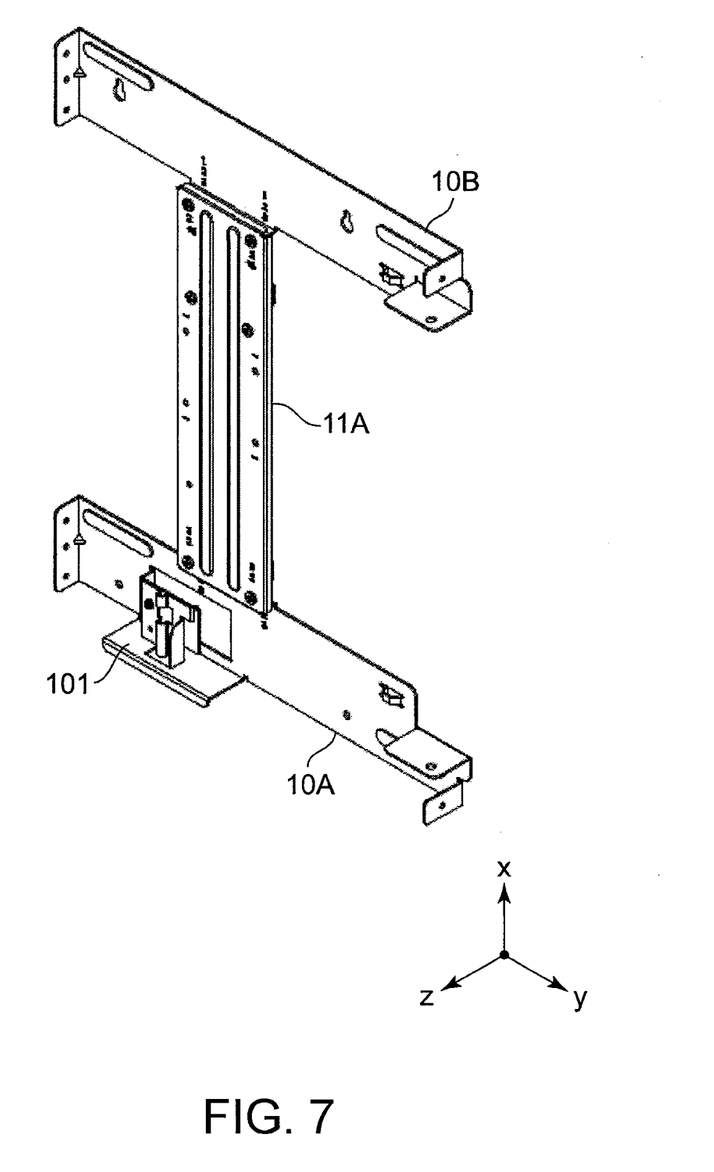
FIG. 7 is a diagram for illustrating another configuration of the support device according to the second embodiment of this invention.

In FIG. 7, a second stage configuration of the support device 1 is illustrated, in which the height-changing portion 11A is perpendicularly arranged between the parallelly-arranged pair of fixing legs 10A and 10B, and an end portion in the longitudinal direction of the height-changing portion 11A is connected to an intermediate portion in the longitudinal direction of the pair of fixing legs 10A and 10B. Also in FIG. 7, in order to facilitate the description, a description of the support legs 12A and 12B is omitted. This support device 1 has a height that allows two housings to be mounted among the basic frame 30A, the extension frame 30B, and the housing frame 30C. With the support device 1 of the second stage configuration illustrated in FIG. 7, the overall height of the fixing legs 10A and 10B and the height-changing portion 11A is the same height as two housings. Note that, also in the second stage configuration, the height-extension portion 11B is stored on the back surface of the height-changing portion 11A.

Figure 8:
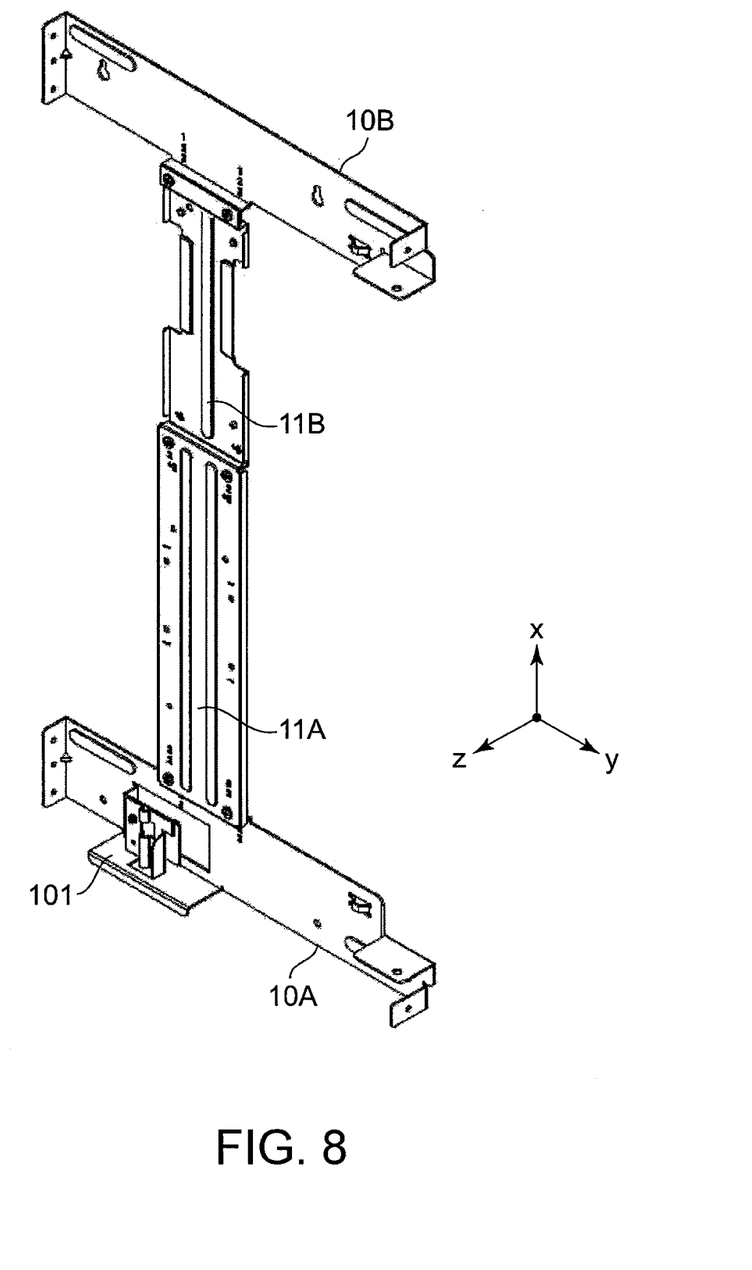
FIG. 8 is a diagram for illustrating yet another configuration of the support device according to the second embodiment of this invention.

In FIG. 8, a third stage configuration of the support device 1 is illustrated, in which the height-changing portion 11A and the height-extension portion 11B are perpendicularly arranged between the parallelly-arranged pair of fixing legs 10A and 10B, and the end portions in the longitudinal direction of the height-changing portion 11A and the height-extension portion 11B are connected to the intermediate portions in the longitudinal direction of the pair of fixing legs 10A and 10B. With the support device 1 according to the third stage configuration, a housing for three housings, that is, the basic frame 30A, the extension frame 30B, and the housing frame 30C, can be received by extending the height-extension portion 11B that has been stored in the height-changing portion 11A. Note that, also in FIG. 8, in order to facilitate the description, a description of the support legs 12A and 12B is omitted.

Figure 9:
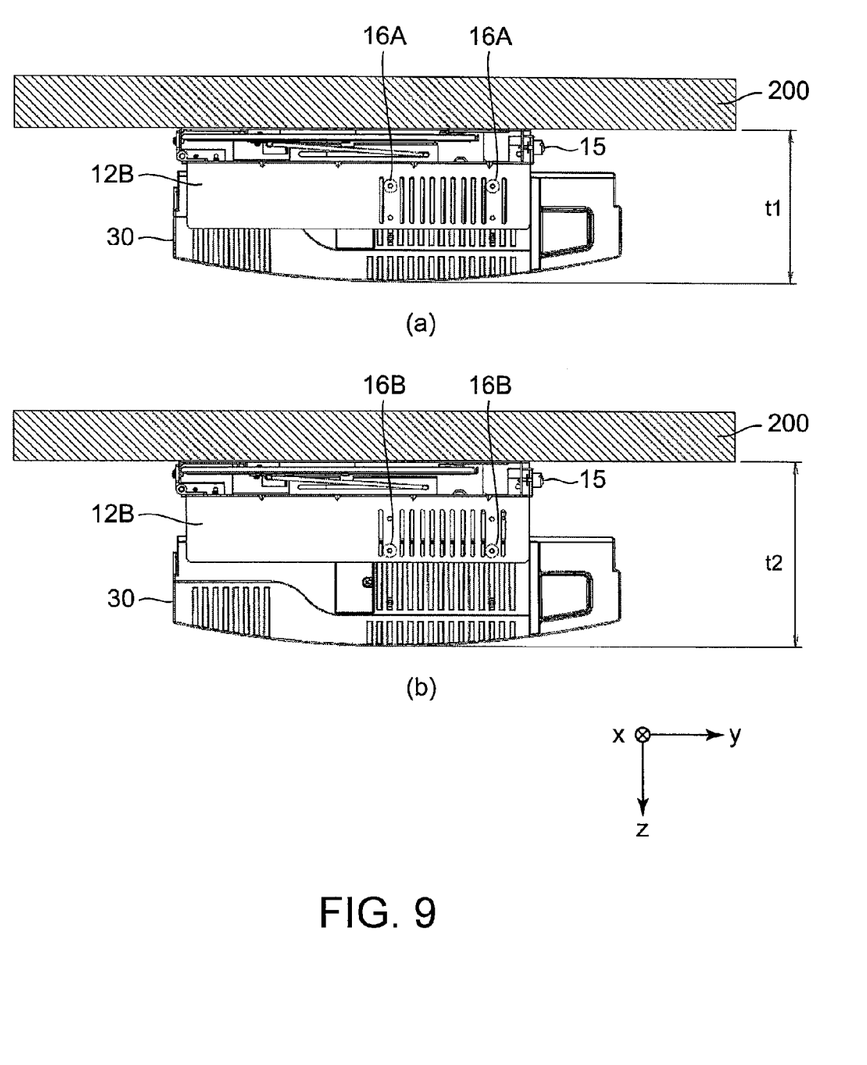
FIG. 9 includes diagrams for illustrating a state in which the support device according to the second embodiment of this invention is mounted to a mounting surface. (a) is a diagram for illustrating a state without a battery, and (b) is a diagram for illustrating a state with a battery.

In FIG. 9, the support device 1 according to this embodiment is fixed to the mounting surface 200 while having the housing 30 mounted thereon. In this embodiment, installation spaces indicated by thicknesses t1 and t2 (depth in the Z-axis direction) from the mounting surface 200 can be adjusted based on the presence/absence of the auxiliary device, such as the battery 50. FIG. 9(*a*) is a diagram for illustrating a configuration when the battery 50 is not mounted to the back surface of the housing 30. In FIG. 9(*a*), the housing 30 is mounted and supported using fixing means, such as a screw, in the housing mounting holes 16A formed on each of the support legs 12A and 12B. With this configuration, because the housing 30 is mounted at a position close to the mounting surface 200, the thickness t1 of the support device 1 and the housing 30 from the mounting surface 200 can be suppressed, which enables space saving to be achieved. FIG. 9(*b*) is a diagram for illustrating a configuration when the battery 50 is mounted to the back surface of the housing 30. The housing 30 is mounted and supported using fixing means, such as a screw, in the housing mounting holes 16B formed on each of the support legs 12A and 12B. Because the housing mounting holes 16B are formed at positions further away from the mounting surface 200 than the housing mounting holes 16A, although the thickness t2 is larger than the thickness t1, a space for mounting the battery between the housing 30 and the support device 1 can be secured.

Thus, according to the embodiment of this invention, the housings 30 having various configurations can be wall-mounted on the mounting surface 200 with a set of support devices 1.

Note that, a method of supporting the housing 30 of an electronic device and the like using the characteristic features included in the first and second embodiments is also included in the scope of this invention.

This invention has been described above with reference to the respective embodiments. However, this invention is not limited to the embodiments described above. The configuration and details of this invention may be changed in various ways that may be understood by the person skilled in the art within the scope of this invention. For example, in the first embodiment, the angle-adjustment shaft 14 is arranged between the fixing leg 10A and the support leg 12A. However, this invention is not limited to the configuration, and for example, the angle-adjustment shaft 14 may be arranged between the fixing leg 10B and the support leg 12B, or may be arranged between the fixing leg 10A and the support leg 12A and between the fixing leg 10B and the support leg 12B. In this case, a shaft mounting portion is formed on the fixing leg 10B, and the shaft fixing grooves 121 and 122 are formed on the support leg 12B. Further, in the embodiments described above, one height-adjustment member 11 is arranged between the pair of fixing legs 10A and 10B. However, as long as the pair of fixing legs 10A and 10B can be strongly fixed to the mounting surface 200 and positioned at the desired height, the height-adjustment member 11 may be omitted. Conversely, in order to reinforce the support device 1, a plurality of the height-adjustment members 11 may be arranged. Further, in the second embodiment, the support device 1 is described that can handle the housing 30 having at most the three stage configuration. However, this invention is not limited to this configuration. Obviously, various configurations may be employed, such as changing the configuration of the height-adjustment member 11 of the support device 1 so that the housing can handle a four stage or five stage configuration.

INDUSTRIAL APPLICABILITY

The support device and the support method according to this invention may be applied to a product relating to wall mounting, as well as a peripheral device used together with an electronic device and the like.

This application claims priority from Japanese Patent Application No. 2013-177190, filed on Aug. 28, 2013, the entire disclosure of which is incorporated herein.

REFERENCE SIGNS LIST

1 support device
10A, 10B fixing leg
101 shaft mounting portion
11 height-adjustment member
11A height-changing portion
11B height-extension portion
12A, 12B support leg
121 shaft fixing groove (fixing at 90°)
122 shaft fixing groove (fixing at 50°)
13 hinge
14 angle-adjustment shaft
15 male screw
16A, 16B housing mounting hole
30 housing
30A basic frame
30B extension frame
30C housing frame
40 option card
50 battery
200 mounting surface

The invention claimed is:

1. A support device, comprising:
a pair of support legs configured to be mounted to a side surface of a housing to support the housing;
a pair of fixing legs configured to be mounted to a mounting surface at which the housing is to be installed to fix the housing at a position at which the housing is to be installed;
a movable mechanism configured to pivotably couple the pair of support legs and the pair of fixing legs; and
an angle-adjustment shaft configured to adjust an angle formed between the mounting surface and the housing mounted to the pair of support legs pivoted by the movable mechanism,
wherein any one or both of the pair of support legs comprise a shaft fixing groove for fixing the housing by a specific angle, the angle-adjustment shaft is fixed to the shaft fixing groove, to thereby fix the housing to the mounting surface by a specific angle,
wherein each of the pair of support legs is a plate-shaped member formed in an L-shape, comprises a plurality of housing mounting holes in a direction away from the mounting surface, and
wherein the housing is supported by mounting each of the pair of support legs to the side surface of the housing so as to cover a corner of the housing.

2. A support device according to claim 1, further comprising a height-adjustment member connected to the pair of fixing legs and configured to position the pair of fixing legs,
wherein the height-adjustment member is connected to the pair of fixing legs, to thereby adjust a height of the pair of support legs coupled to the pair of fixing legs through the movable mechanism.

3. A support device according to claim 2, wherein the height-adjustment member comprises a rectangular-shaped height-changing portion connected to the pair of fixing legs in a longitudinal direction or in a transverse direction and configured to adjust the height of the pair of fixing legs.

4. A support device according to claim 3, wherein the height-adjustment member comprises a height-extension portion configured to extend from the height-changing portion.

5. A support method, comprising:
pivotably coupling a pair of support legs and a pair of fixing legs;
fixing the coupled pair of fixing legs to a mounting surface;
installing a housing on the mounting surface by mounting the housing to the pair of support legs;
adjusting, during maintenance, an angle formed between the mounting surface and the housing by pivoting the pair of support legs,
fixing an angle-adjustment shaft to a shaft fixing groove, to thereby fix the housing mounted to the pair of support legs to the mounting surface by a specific angle,
wherein each of the pair of support legs is a plate-shaped member formed in an L-shape, comprises a plurality of housing mounting holes in a direction away from the mounting surface, and
wherein the housing is supported by mounting each of the pair of support legs to the side surface of the housing so as to cover a corner of the housing.

6. A support method according to claim 5, further comprising:
positioning the pair of fixing legs by connecting a height-adjustment member to the pair of fixing legs; and
adjusting a height of the pair of fixing legs by the height-adjustment member, to thereby also adjust a height of the pair of support legs indirectly coupled to the pair of fixing legs.

7. A support method according to claim 5, further comprising adjusting a depth of the housing mounted to the pair of support legs to the mounting surface, to thereby form a space for installing another member.

* * * * *